United States Patent
Xu et al.

(10) Patent No.: US 9,685,132 B2
(45) Date of Patent: Jun. 20, 2017

(54) GATE DRIVING CIRCUIT UNIT, ARRAY SUBSTRATE, AND DISPLAY DEVICE

(71) Applicant: SHENZHEN CHINA STAR OPTOELECTRONICS TECHNOLOGY CO., LTD., Shenzhen (CN)

(72) Inventors: Feng cheng Xu, Shenzhen (CN); Xiao yu Huang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,293

(22) PCT Filed: Dec. 3, 2014

(86) PCT No.: PCT/CN2014/092959
§ 371 (c)(1),
(2) Date: Apr. 20, 2016

(87) PCT Pub. No.: WO2016/074297
PCT Pub. Date: May 19, 2016

(65) Prior Publication Data
US 2016/0351148 A1    Dec. 1, 2016

(30) Foreign Application Priority Data

Nov. 14, 2014  (CN) .......................... 2014 1 0649963

(51) Int. Cl.
*G09G 3/36*    (2006.01)
*G11C 19/00*    (2006.01)

(52) U.S. Cl.
CPC ........... *G09G 3/3677* (2013.01); *G11C 19/00* (2013.01); *G09G 3/3666* (2013.01);
(Continued)

(58) Field of Classification Search
CPC ......... G09G 3/3677; G09G 2320/0209; G09G 2310/0202; G09G 3/3666; G09G 2300/0426; G11C 19/00
See application file for complete search history.

(56) References Cited

U.S. PATENT DOCUMENTS

| | | |
|---|---|---|
| 2005/0264551 A1 | 12/2005 | Hsieh et al. |
| 2009/0079669 A1 | 3/2009 | Huang et al. |
| 2014/0071355 A1* | 3/2014 | Im ....................... G02F 1/13338 349/12 |

FOREIGN PATENT DOCUMENTS

| | | |
|---|---|---|
| CN | 101561597 A | 10/2009 |
| CN | 101707047 A | 5/2010 |

(Continued)

OTHER PUBLICATIONS

International Search Report and Written Opinion of the International Searching Authority (Forms PCT/ISA/237, PCT/ISA/210 and PCT/ISA/220) issued on Aug. 21, 2015, by the State Intellectual Property Office of China in corresponding International Application No. PCT/CN2014/092959. (11 pages).

*Primary Examiner* — Alexander Eisen
*Assistant Examiner* — Abhishek Sarma
(74) *Attorney, Agent, or Firm* — Buchanan Ingersoll & Rooney PC

(57) ABSTRACT

A gate driving circuit unit, an array substrate, and a display device are disclosed, whereby the problem of high cost resulted from the large amount use of G-COF in the prior art can be solved. The driving circuit unit comprises a first selection unit and a second selection unit, wherein an input end of said first selection unit and an input end of said second selection unit are both connected with a same gate signal line of a G-COF, and an output end of said first selection unit and an output end of said second selection unit are connected with two gate lines respectively. During a first (Continued)

scanning cycle, the first selection unit outputs a high-level signal, and the second selection unit outputs a low-level signal; and during a second scanning cycle, the second selection unit outputs a high-level signal, and the first selection unit outputs a low-level signal.

9 Claims, 2 Drawing Sheets

(52) U.S. Cl.
CPC .............. *G09G 2300/0426* (2013.01); *G09G 2310/0202* (2013.01); *G09G 2320/0209* (2013.01)

(56) References Cited

FOREIGN PATENT DOCUMENTS

| | | |
|---|---|---|
| CN | 101976550 A | 2/2011 |
| CN | 103700354 A | 4/2014 |
| TW | 200539079 A | 12/2005 |
| TW | 200915279 A | 4/2009 |

* cited by examiner

GATE DRIVING CIRCUIT UNIT, ARRAY SUBSTRATE, AND DISPLAY DEVICE

CROSS REFERENCE TO RELATED APPLICATION

The present application claims benefit of Chinese patent application CN 201410649963.4, entitled "Gate Driving Circuit Unit, Array Substrate, and Display Device" and filed on Nov. 14, 2014, which is incorporated herein by reference.

FIELD OF THE INVENTION

The present disclosure relates to the technical field of display, and particularly to a gate driving circuit unit, an array substrate, and a display device.

BACKGROUND OF THE INVENTION

With the development of display technology, the liquid crystal display has become the most commonly used display device. In a liquid crystal display, each pixel is controlled by the gate lines and data lines that are arranged in a staggered manner in the horizontal direction and vertical direction of the display panel, whereby the image can be displayed. The gate driving signal and the data signal are generated from a control chip of the liquid crystal display, and transmitted to the gate lines and data lines of the substrate through Chip On Films (COFs) respectively. The COFs comprise Gate-Chip On Film (G-COF) and Source-Chip On Film (S-COF) according to the different usages thereof.

One gate line of the array substrate is connected with one gate signal line of the G-COF for receiving the gate driving signal. There is limited number of gate signal lines in one G-COF, but a large number of gate lines in the array substrate. Therefore, at least two G-COFs should be used in a liquid crystal display. With the continuous improvement of the resolution of the liquid crystal display, the number of gate lines in the array substrate is increasing accordingly. Therefore, more G-COFs are needed to transmit the gate driving signal, and thus the cost of liquid crystal display is increased.

SUMMARY OF THE INVENTION

The purpose of the present disclosure is to provide a gate driving circuit unit, an array substrate, and a display device, so as to solve the problem of high cost resulted from use of a large number of G-COFs in the prior art.

The present disclosure provides a gate driving circuit unit, comprising a first selection unit and a second selection unit, wherein an input end of said first selection unit and an input end of said second selection unit are both connected with a same gate signal line of a COF, and an output end of said first selection unit and an output end of said second selection unit are connected with two gate lines respectively; wherein during a first scanning cycle, said first selection unit receives a high-level signal output by said gate signal line and outputs a high-level signal, and said second selection unit outputs a low-level signal; and wherein during a second scanning cycle, said second selection unit receives a high-level signal output by said gate signal line and outputs a high-level signal, and said first selection unit outputs a low-level signal.

Further, the gate driving circuit unit comprises a reset unit, wherein an input end of said reset unit is connected with said gate signal line, and an output end of said reset unit is connected with the output end of said first selection unit and the output end of said second selection unit; and wherein during a third scanning cycle, said reset unit receives a low-level signal output by said gate signal line and outputs a low-level signal.

Preferably, said first selection unit comprises a first transistor and a first switch, wherein a gate of said first transistor and a control end of said first switch are both connected with a selection signal line, a source of said first transistor is the input end of said first selection unit, a drain of said first transistor is the output end of said first selection unit, an input end of said first switch is connected with a low-level signal line, and an output end of said first switch is connected with the drain of said first transistor; wherein during the first scanning cycle, said selection signal line outputs a high-level signal, so that said first transistor is turned on while said first switch is turned off, and a high-level signal output by said gate signal line is output through said first transistor; and wherein during the second scanning cycle, said selection signal line outputs a low-level signal, so that said first transistor is turned off while said first switch is turned on, and a low-level signal output by said low-level signal line is output through said first switch.

Preferably, said second selection unit comprises a second transistor and a second switch, wherein a gate of said second transistor and a control end of said second switch are both connected with a selection signal line, an input end of said second switch is the input end of said second selection unit, an output end of said second switch is the output end of said second selection unit, a source of said second transistor is connected with a low-level signal line, and a drain of said second transistor is connected with the output end of said second switch; wherein during the first scanning cycle, said selection signal line outputs a high-level signal, so that said second transistor is turned on while said second switch is turned off, and a low-level signal output by said low-level signal line is output through said second transistor; and wherein during the second scanning cycle, said selection signal line outputs a low-level signal, so that said second transistor is turned off while said second switch is turned on, and a high-level signal output by said gate signal line is output through said second switch.

Preferably, said reset unit comprises a third switch, wherein an input end of said third switch is the input end of said reset unit, an output end of said third switch is the output end of said reset unit, and a control end of said third switch is connected with the input end of said third switch; and wherein during the third scanning cycle, said gate signal line outputs a low-level signal, so that said third switch is turned on, and the low-level signal output by said gate signal line is output through said third switch.

Further, said first switch, said second switch, or said third switch comprises a third transistor and a fourth transistor, wherein a gate of said third transistor is a control end of the switch, a high-level signal is input into a source of said third transistor, and a low-level signal is input into a drain of said third transistor; and wherein a gate of said fourth transistor is connected with the source of said third transistor, a source of said fourth transistor is the input end of the switch, and a drain of said fourth transistor is the output end of the switch.

The present disclosure further provides an array substrate, provided with a plurality of gate lines and said gate driving circuit units, wherein two gate lines of said array substrate is connected with a gate signal line of a COF through said gate driving circuit unit.

The present disclosure further provides a display device, comprising a color film substrate and said array substrate.

The following beneficial effects can be brought about by the present disclosure. In the gate driving circuit unit according to the present disclosure, one gate signal line of the G-COF can be connected with two gate lines through the first selection unit and the second selection unit respectively. During the first scanning cycle, the high-level signal of the gate signal line is output to the first gate line by the first selection unit, and the second selection unit outputs a low-level signal to the second gate line. During the second scanning cycle, the high-level signal of the gate signal line is output to the second gate line by the second selection unit, and the first selection unit outputs a low-level signal to the first gate line.

Therefore, according to the technical solution provided by the present disclosure, one gate signal line of the G-COF driving two gate lines can be realized. In this case, the number of G-COF used therein is halved, and thus the manufacturing cost of the liquid crystal display can be reduced significantly.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The drawings necessary for explaining the embodiments will be introduced briefly below to illustrate the technical solutions of the embodiments of the present disclosure more clearly. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
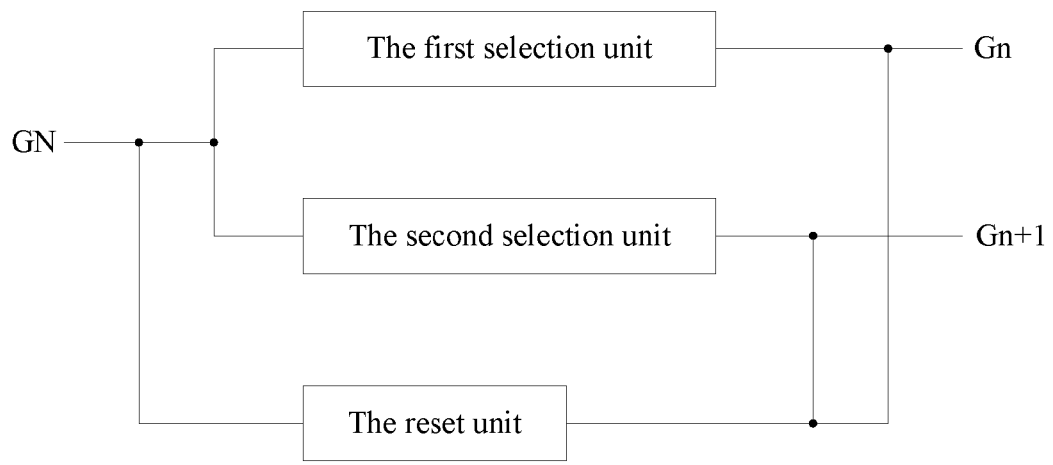
FIG. 1 is a schematic diagram of a gate driving circuit unit according to an embodiment of the present disclosure.

As shown in FIG. 1, an embodiment of the present disclosure provides a gate driving circuit unit, comprising a first selection unit and a second selection unit. An input end of said first selection unit and an input end of said second selection unit are both connected with a same gate signal line GN of a G-COF, and an output end of said first selection unit and an output end of said second selection unit are connected with two gate lines respectively.

According to the present embodiment, a duration of a high-level signal of the gate signal line GN of the G-COF is twice as a scanning cycle. That is, within two continuous scanning cycles, the gate signal line GN always outputs the high-level signal. During a first scanning cycle, the first selection unit receives the high-level signal output by the gate signal line GN and outputs the high-level signal, and the second selection unit outputs a low-level signal. During a second scanning cycle, the second selection unit receives the high-level signal output by the gate signal line GN and outputs the high-level signal, and the first selection unit outputs a low-level signal. In the context of the embodiment according to the present disclosure, the voltage of the high-level signal is 3.3 V, and the voltage of the low-level signal is −7 V.

In the gate driving circuit unit according to the embodiment of the present disclosure, one gate signal line GN of the G-COF can be connected with two gate lines Gn and Gn+1 through the first selection unit and the second selection unit respectively. During the first scanning cycle, the high-level signal of the gate signal line GN is output to Gn by the first selection unit, and the low-level signal is output to Gn+1 by the second selection unit. During the second scanning cycle, the high-level signal of the gate signal line GN is output to Gn+1 by the second selection unit, and the low-level signal is output to Gn by the first selection unit.

Therefore, according to the gate driving circuit unit provided by the embodiment of the present disclosure, one gate signal line of the G-COF driving two gate lines can be realized. In this case, the number of G-COF used therein is halved, the manufacturing cost of the liquid crystal display can be reduced significantly, and the requirement of high resolution of the liquid crystal display can be met.

According to the embodiment of the present disclosure, the gate driving circuit unit further comprises a reset unit. An input end of the reset unit is connected with the gate signal line GN, and an output end of the reset unit is connected with the output end of the first selection unit and the output end of the second selection unit.

During a third scanning cycle, the reset unit receives a low-level signal output by the gate signal line GN, and outputs a low-level signal. Therefore, through providing the reset unit, it is guaranteed that the gate lines Gn and Gn+1 can both output the low-level signal when the gate signal line GN outputs the low-level signal, so that crosstalk and other undesirable phenomena can be avoided.

Figure 2:
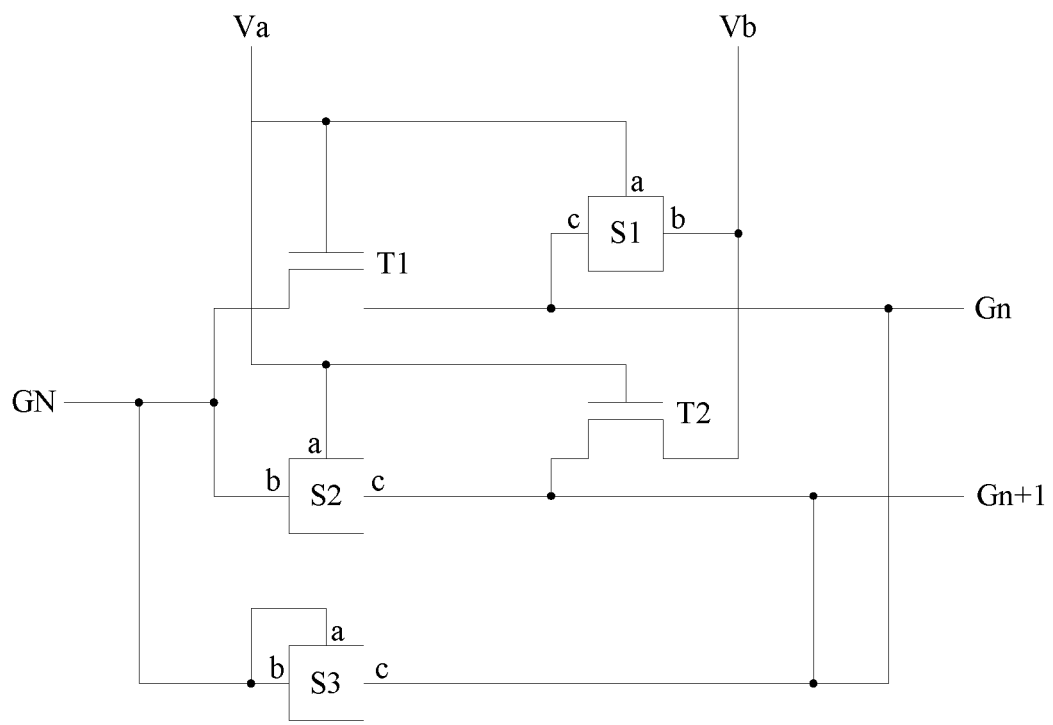
FIG. 2 is a circuit diagram of the gate driving circuit unit according to the embodiment of the present disclosure.

As shown in FIG. 2, according to the present embodiment, the first selection unit specifically comprises a first transistor T1 and a first switch S1. A gate of T1 and a control end a of S1 are both connected with a selection signal line Va, a source of T1 is the input end of the first selection unit, and a drain of T1 is the output end of the first selection unit. An input end b of S1 is connected with a low-level signal line Vb, and an output end c of S1 is connected with the drain of T1. The signal output by the selection signal line Va is a periodic square wave with an amplitude of 3.3 V/−7 V, and the cycle thereof is twice as the scanning cycle.

The second selection unit comprises a second transistor T2 and a second switch S2. A gate of T2 and a control end a of S2 are both connected with a selection signal line Va, an input end b of S2 is the input end of the second selection unit, an output end c of S2 is the output end of the second selection unit, a source of T2 is connected with a low-level signal line, and a drain of T2 is connected with the output end c of S2.

Figure 3:
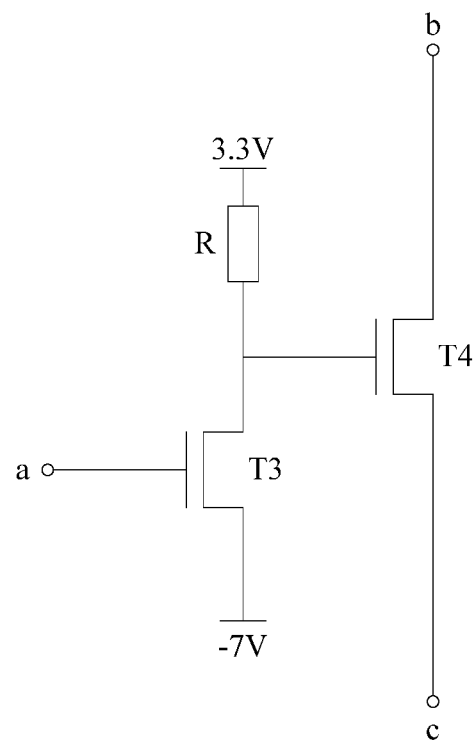
FIG. 3 is a circuit diagram of a switch as shown in FIG. 2.

According to the present embodiment, the circuit structure of S1 is the same as that of S2. As shown in FIG. 3, the switch comprises a third transistor T3 and a fourth transistor T4. A gate of T3 is a control end a of the switch, a high-level signal (the voltage thereof is 3.3 V) is input into a source of T3, a value of a resistor R is an equivalent resistance when T3 is turned on, and a low-level signal (the voltage thereof is −7 V) is input into a drain of T3. A gate of T4 is connected with the source of T3, a source of T4 is the input end b of the switch, and a drain of T4 is the output end c of the switch.

The working principle of the switch is explained as follows. When the control end a is provided with a high-level signal, T3 is turned on, the gate of T4 is provided with a low-level signal, and thus T4 is turned off. That is, when the control end a of the switch is provided with a high-level signal, the connection between the input end b and the output end c is turned off. When the control end a is provided with a low-level signal, T3 is turned off, the gate of T4 is provided with a high-level signal, and thus T4 is turned on. That is, when the control end a of the switch is provided with a low-level signal, the connection between the input end b and the output end c is turned on.

During the first scanning cycle, the selection signal line Va outputs a high-level signal, so that T1 is turned on while S1 is turned off, and a high-level signal output by the gate signal line GN is output to Gn through T1. At the same time, the selection signal line Va outputs a high-level signal, so that T2 is turned on while S2 is turned off, and a low-level signal output by the low-level signal line Vb is output to Gn+1 through T2.

During the second scanning cycle, the selection signal line Va outputs a low-level signal, so that T1 is turned off while S1 is turned on, and a low-level signal output by the low-level signal line Vb is output to Gn through S1. At the same time, the selection signal line Va outputs a low-level signal, so that T2 is turned off while S2 is turned on, and a high-level signal output by the gate signal line GN is output to Gn+1 through S2.

According to the present embodiment, the reset unit further comprises a third switch S3, and the circuit structure and working principle of S3 is the same as those of S1 and S2. An input end b of S3 is the input end of the reset unit, an output end c of S3 is the output end of the reset unit, and a control end a of S3 is connected with the input end b of S3.

During the third scanning cycle, the gate signal line GN outputs a low-level signal, so that S3 is turned on, and the low-level signal output by the gate signal line GN is output to Gn and Gn+1 through S3, so that crosstalk and other undesirable phenomena can be avoided.

Figure 4:
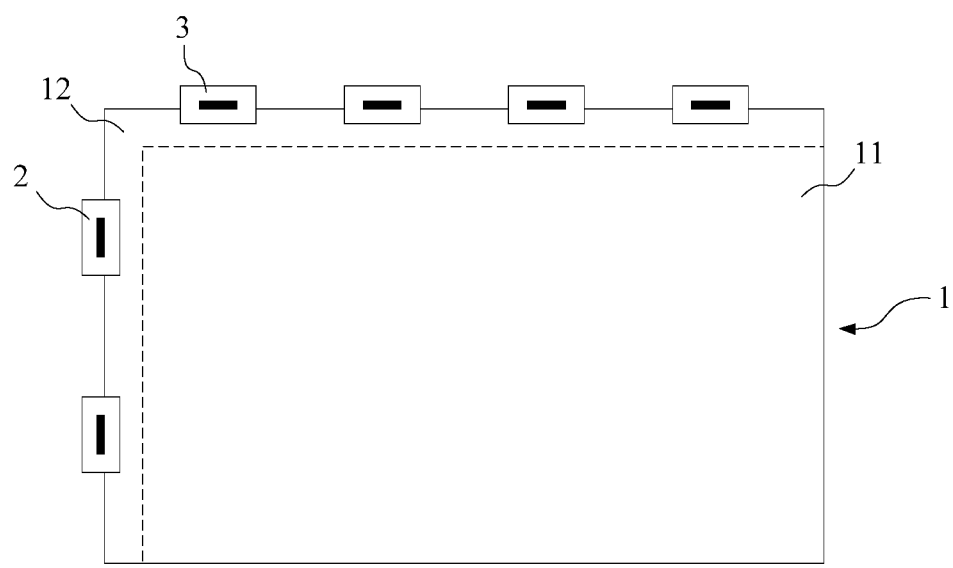
FIG. 4 schematically shows an array substrate according to the embodiment of the present disclosure.

As shown in FIG. 4, the embodiment of the present disclosure further provides an array substrate. A plurality of gate lines and said gate driving circuit units (not shown in FIG. 4) are provided on a display area 11 of the array substrate 1. The array substrate 1 is provided with two G-COFs 2 on its left side, and four S-COFs 3 on its upper side.

The G-COFs 2 and S-COFs 3 are connected with the gate lines and data lines in the display area 11 respectively through fan-shaped lead wires in a lead wire area 12. Two gate lines of the array substrate can be connected with one gate signal line of the G-COFs 2 through the gate driving circuit unit, so that the number of G-COFs 2 used therein can be reduced.

The embodiment of the present disclosure further provides a display device, said display device may be liquid crystal TV, liquid crystal display, mobile phone, tablet personal computer, etc. The display device comprises a color film substrate and the array substrate provided by the above embodiment.

Since the array substrate and display device provided by the embodiment of the present disclosure comprise the same technical features as the gate driving circuit unit provided by the above embodiment, they can solve the same technical problem and achieve the same technical effect.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A gate driving circuit unit, comprising a first selection unit, a second selection unit and a reset unit,
wherein an input end of said first selection unit and an input end of said second selection unit are both connected with a same gate signal line of a COF, and an output end of said first selection unit and an output end of said second selection unit are connected with two gate lines respectively;
wherein during a first scanning cycle, said first selection unit receives a high-level signal output by said gate signal line and outputs a high-level signal, and said second selection unit outputs a low-level signal;
wherein during a second scanning cycle, said second selection unit receives a high-level signal output by said gate signal line and outputs a high-level signal, and said first selection unit outputs a low-level signal;
wherein an input end of said reset unit is connected with said gate signal line, and an output end of said reset unit is connected with the output end of said first selection unit and the output end of said second selection unit; and
wherein during a third scanning cycle, said reset unit receives a low-level signal output by said gate signal line and outputs a low-level signal.

2. The gate driving circuit unit according to claim 1, wherein said first selection unit comprises a first transistor and a first switch;
wherein a gate of said first transistor and a control end of said first switch are both connected with a selection signal line, a source of said first transistor is the input end of said first selection unit, a drain of said first transistor is the output end of said first selection unit, an input end of said first switch is connected with a low-level signal line, and an output end of said first switch is connected with the drain of said first transistor;
wherein during the first scanning cycle, said selection signal line outputs a high-level signal, so that said first transistor is turned on while said first switch is turned off, and a high-level signal output by said gate signal line is output through said first transistor; and
wherein during the second scanning cycle, said selection signal line outputs a low-level signal, so that said first transistor is turned off while said first switch is turned on, and a low-level signal output by said low-level signal line is output through said first switch.

3. The gate driving circuit unit according to claim 1, wherein said second selection unit comprises a second transistor and a second switch;
wherein a gate of said second transistor and a control end of said second switch are both connected with a selection signal line, an input end of said second switch is the input end of said second selection unit, an output end of said second switch is the output end of said second selection unit, a source of said second transistor is connected with a low-level signal line, and a drain of said second transistor is connected with the output end of said second switch;

wherein during the first scanning cycle, said selection signal line outputs a high-level signal, so that said second transistor is turned on while said second switch is turned off, and a low-level signal output by said low-level signal line is output through said second transistor; and wherein during the second scanning cycle, said selection signal line outputs a low-level signal, so that said second transistor is turned off while said second switch is turned on, and a high-level signal output by said gate signal line is output through said second switch.

4. The gate driving circuit unit according to claim 1, wherein said reset unit comprises a third switch;

wherein an input end of said third switch is the input end of said reset unit, an output end of said third switch is the output end of said reset unit, and a control end of said third switch is connected with the input end of said third switch; and wherein during the third scanning cycle, said gate signal line outputs a low-level signal, so that said third switch is turned on, and the low-level signal output by said gate signal line is output through said third switch.

5. The gate driving circuit unit according to claim 2, wherein said first switch comprises a third transistor and a fourth transistor;

wherein a gate of said third transistor is a control end of said first switch, a high-level signal is input into a source of said third transistor, and a low-level signal is input into a drain of said third transistor; and wherein a gate of said fourth transistor is connected with the source of said third transistor, a source of said fourth transistor is the input end of said first switch, and a drain of said fourth transistor is the output end of said first switch.

6. The gate driving circuit unit according to claim 3, wherein said second switch comprises a third transistor and a fourth transistor;

wherein a gate of said third transistor is a control end of said second switch, a high-level signal is input into a source of said third transistor, and a low-level signal is input into a drain of said third transistor; and wherein a gate of said fourth transistor is connected with the source of said third transistor, a source of said fourth transistor is the input end of said second switch, and a drain of said fourth transistor is the output end of said second switch.

7. The gate driving circuit unit according to claim 4, wherein said third switch comprises a third transistor and a fourth transistor;

wherein a gate of said third transistor is a control end of said third switch, a high-level signal is input into a source of said third transistor, and a low-level signal is input into a drain of said third transistor; and wherein a gate of said fourth transistor is connected with the source of said third transistor, a source of said fourth transistor is the input end of said third switch, and a drain of said fourth transistor is the output end of said third switch.

8. An array substrate, provided with a plurality of gate lines and gate driving circuit units, wherein each said gate driving circuit unit comprises a first selection unit, a second selection unit and a reset unit;

wherein an input end of said first selection unit and an input end of said second selection unit are both connected with a same gate signal line of a COF, and an output end of said first selection unit and an output end of said second selection unit are connected with two gate lines respectively;

wherein during a first scanning cycle, said first selection unit receives a high-level signal output by said gate signal line and outputs a high-level signal, and said second selection unit outputs a low-level signal;

wherein during a second scanning cycle, said second selection unit receives a high-level signal output by said gate signal line and outputs a high-level signal, and said first selection unit outputs a low-level signal;

wherein an input end of said reset unit is connected with said gate signal line, and an output end of said reset unit is connected with the output end of said first selection unit and the output end of said second selection unit;

wherein during a third scanning cycle, said reset unit receives a low-level signal output by said gate signal line and outputs a low-level signal; and wherein two gate lines of said array substrate is connected with a gate signal line of a COF through said gate driving circuit unit.

9. A display device, comprising a color film substrate and an array substrate, said array substrate being provided with a plurality of gate lines and gate driving circuit units, wherein each said gate driving circuit unit comprises a first selection unit, a second selection unit and a reset unit;

wherein an input end of said first selection unit and an input end of said second selection unit are both connected with a same gate signal line of a COF, and an output end of said first selection unit and an output end of said second selection unit are connected with two gate lines respectively;

wherein during a first scanning cycle, said first selection unit receives a high-level signal output by said gate signal line and outputs a high-level signal, and said second selection unit outputs a low-level signal;

wherein during a second scanning cycle, said second selection unit receives a high-level signal output by said gate signal line and outputs a high-level signal, and said first selection unit outputs a low-level signal;

wherein an input end of said reset unit is connected with said gate signal line, and an output end of said reset unit is connected with the output end of said first selection unit and the output end of said second selection unit;

wherein during a third scanning cycle, said reset unit receives a low-level signal output by said gate signal line and outputs a low-level signal; and wherein two gate lines of said array substrate is connected with a gate signal line of a COF through said gate driving circuit unit.

* * * * *